United States Patent
Nakayama et al.

(10) Patent No.: US 8,293,653 B2
(45) Date of Patent: Oct. 23, 2012

(54) METHOD OF MANUFACTURING A SEMICONDUCTOR DEVICE

(75) Inventors: Tomoo Nakayama, Kanagawa (JP); Yoshiko Kasama, Kanagawa (JP); Eiichi Fujikura, Yamagata (JP); Atsushi Kikuchi, Yamagata (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 291 days.

(21) Appl. No.: 12/656,981

(22) Filed: Feb. 22, 2010

(65) Prior Publication Data

US 2010/0221912 A1    Sep. 2, 2010

(30) Foreign Application Priority Data

Feb. 27, 2009 (JP) ................................. 2009-046801

(51) Int. Cl.
   *H01L 21/302* (2006.01)
(52) U.S. Cl. ................. 438/706; 257/906; 257/E21.228
(58) Field of Classification Search .................. 438/630, 438/637, 672, 706, 723, 724, 906, 974; 257/E21.224, E21.228
   See application file for complete search history.

(56) References Cited

U.S. PATENT DOCUMENTS

| | | | |
|---|---|---|---|
| 5,549,798 A | 8/1996 | Kitajima et al. | |
| 6,290,777 B1 | 9/2001 | Imaoka et al. | |
| 6,565,736 B2 | 5/2003 | Park et al. | |
| 7,078,345 B2 * | 7/2006 | Iinuma | 438/694 |
| 2008/0197426 A1 * | 8/2008 | Okazaki | 257/411 |

FOREIGN PATENT DOCUMENTS

| | | |
|---|---|---|
| CN | 1113034 A | 12/1995 |
| CN | 1228197 A | 9/1999 |
| CN | 1501448 A | 6/2004 |
| JP | 2002-146574 | 5/2002 |
| JP | 2007-234760 | 9/2007 |

OTHER PUBLICATIONS

English translation of Chinese Office Action dated Oct. 26, 2011.
English translation (partial) of Chinese Office Action dated Aug. 1, 2012.

* cited by examiner

*Primary Examiner* — Quoc Hoang
(74) *Attorney, Agent, or Firm* — McGinn IP Law Group, PLLC

(57) ABSTRACT

A method of manufacturing a semiconductor device includes a process of removing, by dry etching, an insulating layer which is formed on the top surface of a Ni-containing silicide layer to thereby at least partially expose the Ni-containing silicide layer; and a process of cleaning the exposed portion of the Ni-containing silicide layer using reduced water having a reductive function.

20 Claims, 5 Drawing Sheets

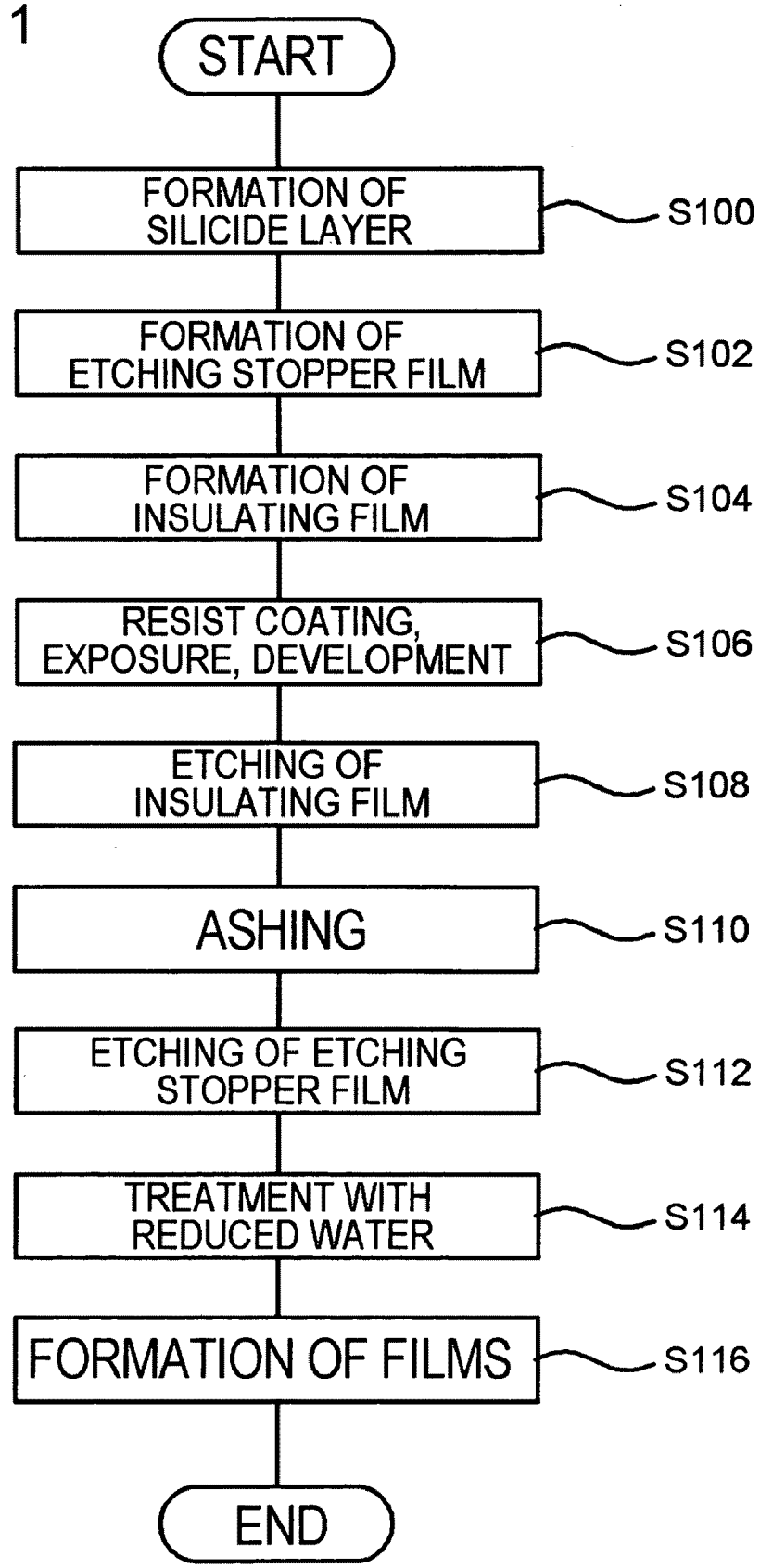

METHOD OF MANUFACTURING A SEMICONDUCTOR DEVICE

This application is based on Japanese patent application No. 2009-046801 the content of which is incorporated hereinto by reference.

BACKGROUND

1. Technical Field

The present invention relates to a method of manufacturing a semiconductor device.

2. Related Art

In association with dimensional shrinkage, increase in the degree of integration and increase in operation speed of semiconductor devices, there has been a growing demand on lower resistivity of silicides formed on the gate electrodes and source/drain (impurity-diffused layer) regions. The situation has therefore promoted adoption of a Ni-containing silicide film which contains NiSi, NiPtSi or the like.

On the other hand, the silicide film has also been required to ensure a large selectivity in the process of dry etching for forming contact plugs, in order to prevent penetration through the thin silicide film, and to keep a necessary thickness of side walls. The situation, however, makes it more difficult to concomitantly satisfy removal of the depositional substance produced in the process, and oxidative solubilization of the silicide.

As an exemplary method of forming contact holes in an insulating film formed on a silicide layer, Japanese Laid-Open Patent Publication No. 2007-234760 describes a technique as described below.

According to Japanese Laid-Open Patent Publication No. 2007-234760, a SiN film is formed as an etching stopper film on a silicide layer, and a silicon oxide film is formed thereon as an interlayer insulating film. A resist film having a predetermined pattern which contain openings, through which contact holes are formed, is then formed, the silicon oxide film is then selectively removed by dry etching using the resist film as a mask, and the resist film is removed typically by $O_2$ plasma ashing. Thereafter, the SiN film as the etching stopper film is selectively removed, using the silicon oxide film as a mask. The contact holes are formed in this way. According to the method of forming the contact holes described in the Publication, since the ashing takes place while leaving the SiN film as the etching stopper film unremoved, so that silicide layer may be prevented from being directly exposed to the $O_2$ plasma.

In the above-described tendency towards lower resistivity, adoption of the Ni-containing silicide layer, such as NiSi, as the silicide has raised an additional need of keeping a large selectivity in the process of etching of SiN film used as the higher etching stopper film, with respect to the Ni silicide layer. As a consequence, the SiN film has necessarily been etched under conditions more likely to produce depositional substance in order to ensure such large selectivity, so that the depositional substance has been more likely to produce at the bottoms of the contact holes. Cleaning for removing the depositional substance is now a matter of importance, after the contact holes are formed.

This sort of depositional substance has generally been removed by ashing, or by cleaning using a mixed solution of aqueous ammonia and aqueous hydrogen peroxide solution (occasionally referred to as ammonia/hydrogen peroxide solution, hereinafter), hydrofluoric acid solution, or a mixed solution of sulfuric acid and aqueous hydrogen peroxide solution (occasionally referred to as sulfuric acid/hydrogen peroxide solution, hereinafter).

Japanese Laid-Open Patent Publication No. 2007-234760 discloses a process of forming the contact holes, followed by acid cleaning using hydrofluoric acid or the like, and treatment using an alkaline chemical. The Publication also discloses RF etching of the surface of the silicide layer.

Japanese Laid-Open Patent Publication No. 2002-146574 discloses that active cathode water and active anode water may also be applicable also to cleaning which is carried out after the openings, allowing the silicide layer to expose therein, are formed by etching.

According to the Publication, aqueous electrolyte solution which composes the active cathode water and active anode water contains 1 to 30% by mass of ammonium hydroxide and 1 to 30% by mass of fluoride.

The present inventors have recognized as follows. The related arts disclosed in the above-described Publications have, however, been suffering from a problem in the aspect below.

In the related art described Japanese Laid-Open Patent Publication No. 2007-234760, removal of the depositional substance on the silicide layer is accompanied by oxidation typically using an acid-containing aqueous solution or by oxygen plasma treatment. In the related art described in Japanese Laid-Open Patent Publication No. 2002-146574, the cleaning using an aqueous electrolyte solution containing 1 to 30% by mass of ammonium hydroxide essentially needs a succeeding process of rinsing with water.

However, the silicide layer, in particular Ni silicide layer, is susceptible to oxidation even by such rinsing using water.

As described in the above, removal of the depositional substance on the silicide layer by the related arts have been associated with undesirable oxidation of the silicide layer.

SUMMARY

According to the present invention, there is provided a method of manufacturing a semiconductor device which includes:

removing, by dry etching, an insulating layer which is formed on a Ni-containing silicide layer to thereby at least partially expose the Ni-containing silicide layer; and cleaning the exposed portion of the Ni-containing silicide layer using reduced water.

The depositional substance produced in the dry etching, deposited on the Ni-containing silicide layer, may now be cleaned using reduced water.

According to the present invention, a method of manufacturing a semiconductor device, capable of removing the depositional substance without oxidizing the silicide layer, may be provided.

BRIEF DESCRIPTION OF THE DRAWINGS

The above and other objects, advantages and features of the present invention will be more apparent from the following description of a certain preferred embodiment taken in conjunction with the accompanying drawings, in which:

FIG. 1 is a flow chart illustrating procedures of manufacturing a semiconductor device in one embodiment of the present invention;

DETAILED DESCRIPTION

Figure 2A:
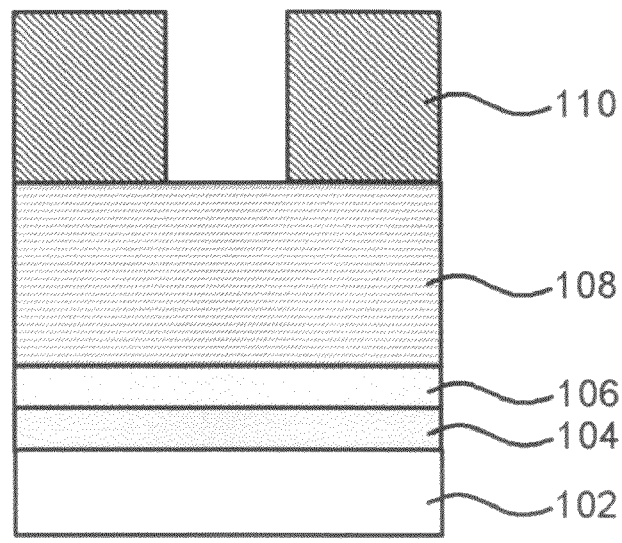
FIGS. 2A to 2C and FIGS. 3A to 3C are sectional views illustrating processes of manufacturing a semiconductor device in one embodiment of the present invention.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

One embodiment of the present invention will be explained referring to the attached drawings. Note that any similar constituents in all drawings will be given similar numerals or symbols, and explanations therefor will not be repeated.

A method of manufacturing a semiconductor device of this embodiment will be explained referring to FIG. 1 to FIG. 3C.

FIG. 1 is a flow chart illustrating procedures of manufacturing a semiconductor device in this embodiment, and FIGS. 2A to 2C and FIGS. 3A to 3C are sectional views illustrating processes of manufacturing the semiconductor device in this embodiment.

In this embodiment, first, a Ni-containing silicide layer 104 is formed on a semiconductor substrate 102 (S100). An etching stopper film 106 is then formed on the Ni-containing silicide layer 104 (S102). An insulating film 108 is then formed on the etching stopper film 106 (S104). Thereafter, a resist layer 110 having a predetermined pattern is formed on the insulating film 108 (S106), and the insulating film 108 is then etched using the resist layer 110 as a mask, to thereby form a contact hole (opening) (S108). The resist layer 110 is then removed by ashing (S110).

Next, the etching stopper film 106 is removed by dry etching using the insulating film 108 as a mask (S112). As a consequence, the Ni-containing silicide layer 104 is exposed at the bottom of the contact hole. The product is then cleaned using reduced water 114 (S114). By the cleaning, a depositional substance 112 in the contact hole may be removed, and thereby the surface of the Ni-containing silicide layer 104 may be cleaned. In this embodiment, the reduced water 114 may be a basic, reductive aqueous solution.

In this embodiment, the semiconductor substrate 102 is then transferred to a film growth chamber, while keeping the surface of the Ni-containing silicide layer 104 protected. Next, in the film growth chamber, an electro-conductive film is grown in the contact hole as a metal film 116 (S116).

The above-described processes will be explained below in further detail. Note that the drawings illustrate only a silicided portion on the source/drain regions, while abridging description on gate insulating film, gate electrode and so forth which are not essential to the present invention.

The Ni-containing silicide layer 104 may preferably be selected from NiSi layer, NiPtSi layer, and stack of these layers, and may be manufactured as described below. An example herein will deal with the case of adopting the NiSi layer. First, a Ni film as the metal film (having a thickness of approximately 5 nm or larger and 20 nm or smaller) is formed by sputtering, on the top surface of the semiconductor substrate 102 composed of a silicon substrate. The product is then subjected to first annealing (sintering) at 250° C. or higher and 350° C. or lower. As a consequence, a $Ni_2Si$ layer is formed. Thereafter, an unreacted portion of the metal film is removed by etching typically using SPM (Sulfuric acid/hydrogen Peroxide(/water) Mixture). The product is then subjected to second annealing (sintering) at 350° C. or higher and 400° C. or lower, to thereby form a NiSi layer.

In the method of manufacturing a semiconductor device 100 of this embodiment, the insulating layer preferably contains at least a first insulating film (the etching stopper film 106), and a second insulating film (the insulating film 108) formed thereon.

The process of forming the contact hole preferably contains a process of selectively etching the insulating film 108 using a resist layer as a mask, a process of removing the resist layer, and a process of selectively etching the etching stopper film 106 using the insulating film 108 as a mask.

The etching stopper film 106 may be configured typically by using a SiN film. The etching stopper film 106 may be formed typically by atomic layer deposition (ALD). The insulating film 108 may be configured typically by using a silicon oxide ($SiO_2$) film.

Figure 2B:
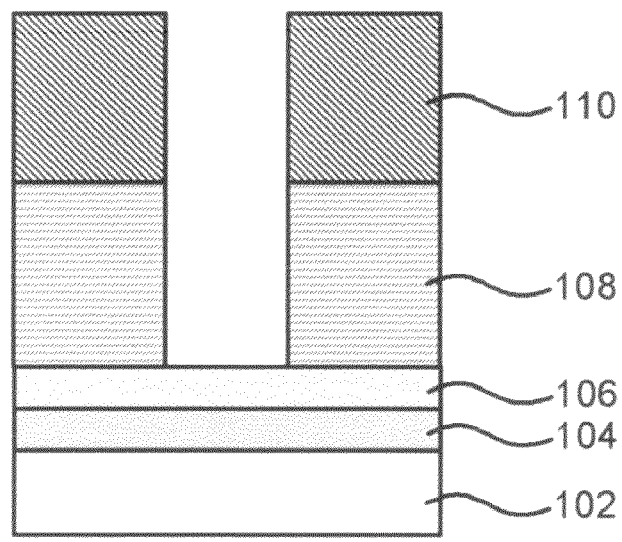
Figure 2C:
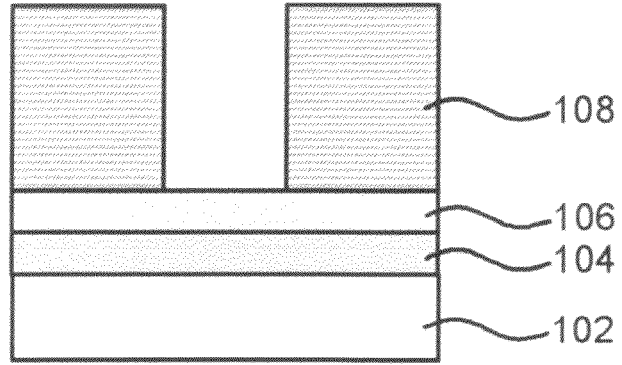
Figure 3A:
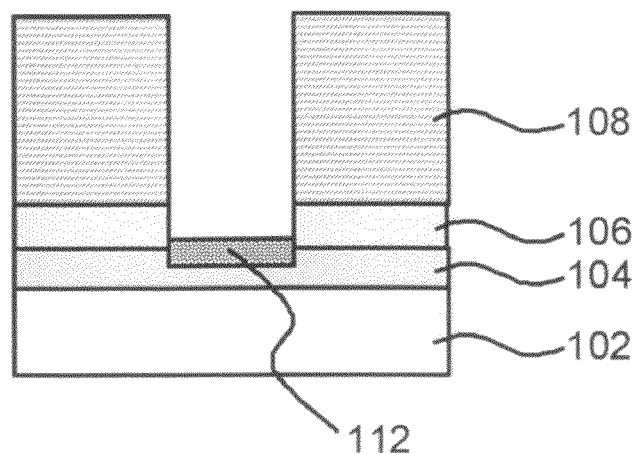

Next, the resist layer 110 having a predetermined pattern which contains an opening allowing therein formation of the contact hole, is formed on the insulating film 108 (FIG. 2A). Next, the insulating film 108 is selectively removed by dry etching, using the resist layer 110 as a mask (FIG. 2B). Next, the resist layer 110 is removed by ashing, or by wet etching using SPM or APM (FIG. 2C). The etching stopper film 106 is then selectively removed by dry etching using the insulating film 108 as a mask (FIG. 3A). In this way, a recess (contact hole) which is bottomed on the Ni-containing silicide layer 104 is formed.

In the dry etching of the etching stopper film 106 (S112), a gas having a large H ratio, such as $CH_3F$, is preferably used, in view of ensuring a satisfactory level of selectivity. Still alternatively, fluorocarbon gases such as $CH_2F_2$ and $CHF_3$ may be used. The gas may contain oxygen or the like.

Figure 3B:
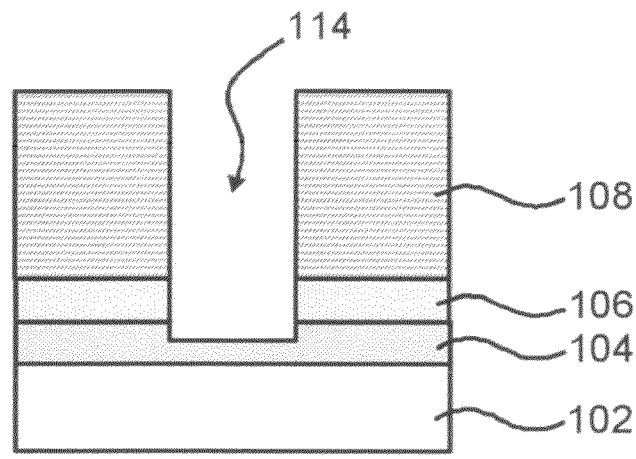

The contact hole in this process, however, has the depositional substance 112 accumulated therein as a result of dry etching. In this embodiment, such depositional substance 112 remaining in the contact hole is removed by cleaning using the reduced water 114 (FIG. 3B, and step S114 in FIG. 1). By the cleaning, the depositional substance 112 is removed, and thereby the Ni-containing silicide layer 104 is cleaned. It is to be understood that the cleaning herein also includes simple rinsing.

The method of manufacturing the semiconductor device 100 of this embodiment preferably includes a process of removing, by dry etching, an insulating layer which is formed on the top surface of the Ni-containing silicide layer 104 to thereby at least partially expose the Ni-containing silicide layer 104; and cleaning the exposed portion of the Ni-containing silicide layer 104 using reduced water 114.

The method further preferably includes a process of forming a recess (contact hole) in the insulating layer, and a process of cleaning the contact hole with the reduced water 114.

The reduced water, which is aimed at preventing the Ni-containing silicide layer 104 from being oxidized by protecting the surface thereof by the OH groups, is preferably a hydrogen-enriched water or an electrolytically reduced water which contains 0.01 ppm or more of ammonia, when measured immediately before being supplied for the cleaning. The reduced water is also preferably a hydrogen-enriched water or an electrolytically reduced water which contain 1000 ppm or less of ammonia, so as to make rinsing with water no more necessary after the treatment with the reduced water.

The ammonia concentration is more preferably falls in the range from 0.1 ppm or more and 100 ppm or less. The reduced water having the ammonia concentration adjusted in this range exhibits basicity. The ammonia concentration was calculated from pH value measured using a pH meter, immediately before the treatment with the reduced water. The pH meter adoptable herein may be any of those commercially available.

The reduced water preferably has a pH value larger than 7, and has a negative ORP (oxidation-reduction potential). The reduced water more preferably has a pH value larger than 8. In view of removing the depositional substance by virtue of the basicity, the reduced water more preferably has an ORP value smaller than −100 mV. In particular, the ORP value is more preferably −800 mV or larger, and −500 mV or smaller. The reduced water having the ORP value adjusted in this range exhibits basicity.

pH was measured using a pH meter, immediately before the treatment with the reduced water. The oxidation-reduction potential was measured using an ORP meter immediately before the treatment with the reduced water. The ORP meter adoptable herein may be any of those commercially available.

The reduced water may be used at room temperature, or at a temperature appropriately higher than the room temperature.

The electrolytically reduced water is a liquid produced on the cathode side as a result of electrolysis of water containing a small amount of ammonium ion (1% by mass or less). An apparatus for producing the electrolytically reduced water may be a two-part electrolytic apparatus, or may alternatively be a three-part electrolytic apparatus. The hydrogen-enriched water is preferably water obtained by dissolving hydrogen gas, which is produced at the cathode as a result of electrolysis, or supplied from a bomb, into an aqueous dilute ammonia solution.

Desired values of pH and oxidation-reduction potential may be achievable by adjusting the amount of ammonium ion, and desired value of oxidation-reduction potential may be achievable also by adjusting the amount of dissolved hydrogen gas.

Both modes of treatment of the single-wafer mode and batch mode may be adoptable to the cleaning with the reduced water. Duration of time of treatment may preferably 30 seconds or longer, and particularly 60 seconds or longer and 180 seconds or shorter.

The cleaning with the reduced water is not necessarily followed by rinsing for removing the reduced water, using purified water or other kinds of water.

Accordingly, in the method of manufacturing the semiconductor device 100 of this embodiment, the Ni-containing silicide layer 104 may be kept unexposed to water, over the period from the point of time when the Ni-containing silicide layer 104 is covered with the reduced water after the cleaning with the reduced water, and up to the point of time when a barrier metal and the metal film are formed in the contact hole.

Figure 4A:
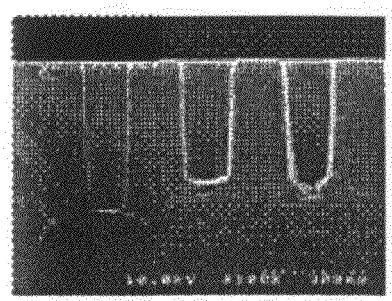
FIGS. 4A to 4E are sectional SEM images of contact holes formed in an insulating film.
Figure 4B:
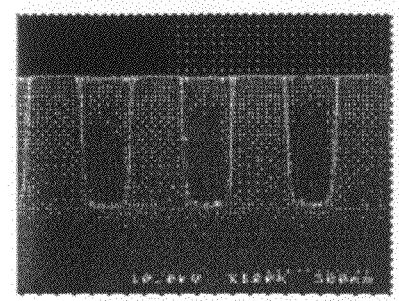
Figure 4C:
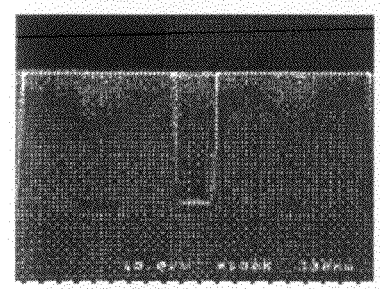
Figure 4D:
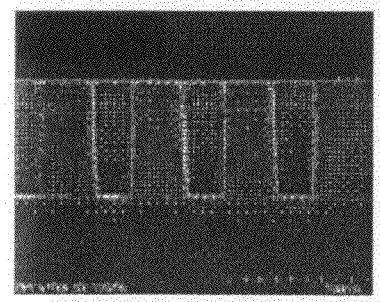
Figure 4E:
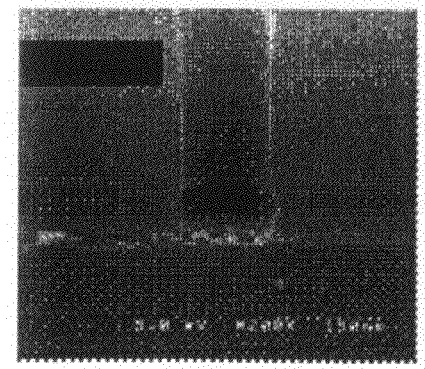
Figure 5A:
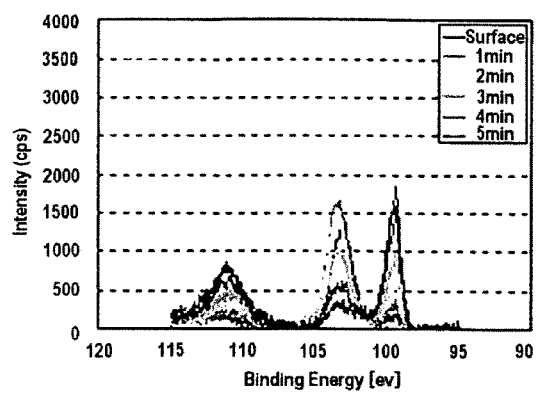
FIGS. 5A to 5D are X-ray photoelectron spectral (XPS) charts of the bottoms of the contact holes.
Figure 5B:
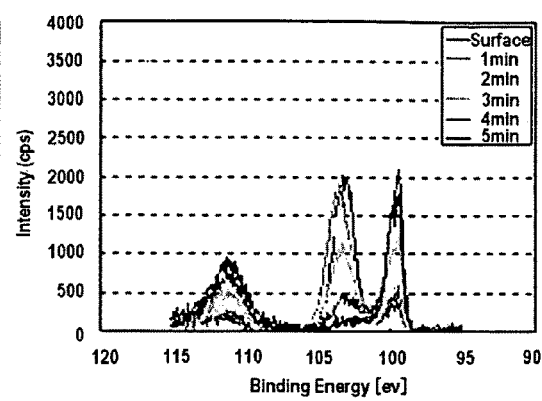
Figure 5C:
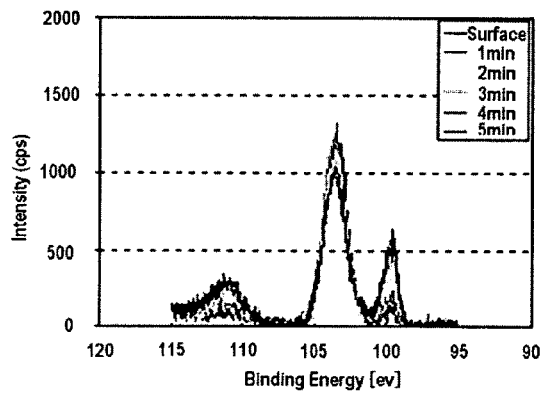
Figure 5D:
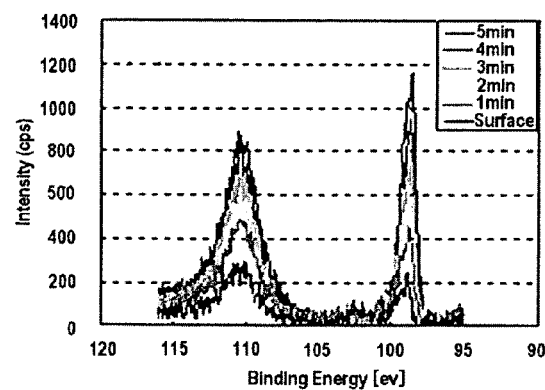

FIGS. 4A to 4E are sectional SEM images of the contact holes. Shown herein are result after the dry etching (FIG. 4A), results after conventional processes of cleaning (by ashing in FIG. 4B, by cleaning with sulfuric acid/hydrogen peroxide solution in FIG. 4C, and by cleaning with dilute hydrofluoric acid in FIG. 4E) after the dry etching, and result after the cleaning with the reduced water according to this embodiment after the dry etching (FIG. 4D). FIGS. 5A to 5D are XPS charts of the bottoms of the contact holes measured one to five minutes after the individual processes, at one-minute intervals. Shown herein are XPS charts obtained after the dry etching (FIG. 5A), obtained after conventional processes of cleaning (by ashing in FIG. 5B, and by cleaning with sulfuric acid/hydrogen peroxide solution in FIG. 5C) after the dry etching, and obtained after the cleaning with the reduced water according to this embodiment after the dry etching (FIG. 5D).

The reduced water used herein has an ammonia concentration of 10 ppm, pH9.5, and an oxidation-reduction potential of −600 mV.

At a glance, the ashing (FIG. 4B) and cleaning with sulfuric acid/hydrogen peroxide solution (FIG. 4C) seems to succeeded in removal of the depositional substance, as judged from the SEM images. However, comparison with the result obtained after treatment with the reduced water in this embodiment (FIG. 4D) reveals that the removal with SPM is not sufficient at the bottoms of the contact holes. It is also found that the DHF treatment (FIG. 4E) causes undesirable etching of the insulating film and the bottoms of the contact holes.

In addition, the XPS chart obtained after the etching (FIG. 5A), and obtained after the conventional processes of cleaning (by ashing in FIG. 5B, and by cleaning with sulfuric acid/hydrogen peroxide solution in FIG. 5C) after the dry etching show peaks at approximately 103 eV, supposedly indicating presence of $SiO_2$.

In comparison therewith, the XPS chart obtained after the cleaning with the reduced water in this embodiment (FIG. 5D) shows no peak ascribable to $SiO_2$, indicating that the NiSi film exposes to the bottoms of the contact holes.

This is supposedly because an electro-conduction inhibitor ($SiO_2$) on the NiSi film was reduced, by a reductive function of the reduced water characterized by a negative ORP.

It was also found after the cleaning with the reduced water, that no peak ascribable to $SiO_2$ was observed by XPS at the bottoms of the contact holes, at any point of time one to five minutes after the cleaning. Accordingly, the surface of the Ni-containing silicide layer 104 may be prevented from being oxidized at the bottoms of the contact holes, over a prolonged duration of time after the treatment with the reduced water.

Referring now back to the related art disclosed in Japanese Laid-Open Patent Publication No. 2002-146574, the cleaning with the active cathode water was necessarily followed by rinsing with water, due to an ammonium hydroxide concentration of as high as 1 to 30% by mass. Although Ni silicide is not disclosed as the silicide in this Publication, if the silicide were Ni silicide, the rinsing with water would result in undesirable oxidation of the Ni-containing silicide layer.

In contrast, according to the method of manufacturing the semiconductor device 100 of this embodiment, the rinsing with water is no longer necessary after the treatment with the reduced water. Accordingly, after the process of allowing the Ni-containing silicide layer 104 to expose, the exposed surface may be cleaned using the reduced water, without subjecting the exposed surface to any treatment using a gas which contains an oxidative gas, and without exposing the exposed surface to any liquid of pH≦ (not more than) 7.

In addition, after the process of cleaning with the reduced water, a process of drying the cleaned surface may be carried out, without exposing the cleaned surface to any liquid of pH≦7, such as SPM.

Figure 3C:
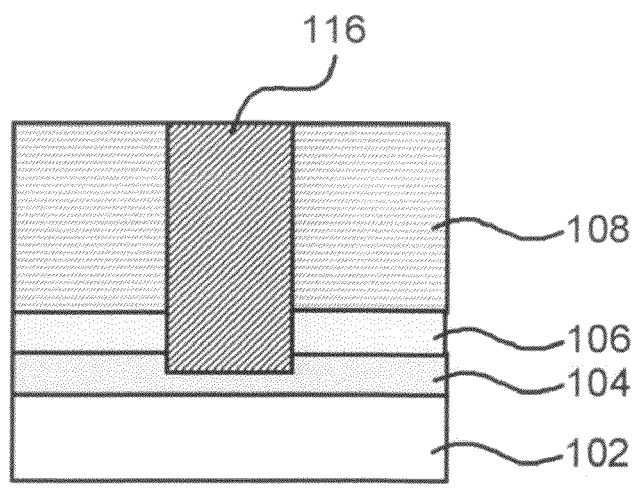

The semiconductor substrate 102 is then transferred to a film growth chamber. Next, the electro-conductive metal film 116 is formed in the contact hole (FIG. 3C).

In the method of manufacturing the semiconductor device 100 of this embodiment, after the process of drying the cleaned surface, the barrier metal and the metal film 116 may be formed in the contact hole. More specifically, after the process of drying the cleaned surface, the barrier metal and the metal film 116 are formed in the contact hole (recess), without subjecting the dried surface to any treatment using a gas which contains an oxidative gas, and without exposing the dried surface to any liquid of pH≦7.

The metal film 116 and the barrier metal may configure a stacked structure.

Ti, for example, may preferably be adoptable to the metal film 116. Layers composed of W, Ti, Ta, nitrides of these elements, or stacks of these elements may preferably be adoptable to the barrier metal.

The embodiment of the present invention has been explained, of course without limiting the present invention.

For example, the embodiment of the present invention may be adoptable also to a silicide layer typically on a gate electrode, rather than being limited to a silicide layer on an impurity diffused layer.

The Ni-containing silicide layer may be formed in a self-aligned manner (such as in the SALICIDE process). The Ni silicide layer may be any of those containing Ni, such as NiPtSi layer, rather than being limited to NiSi layer, or may be a stack of these layers.

The stoichiometric ratio of these element may be arbitrary, so that it is not always necessary for NiSi to have a compositional ratio of Ni and Si of 1:1.

The etching stopper film 106 is not limited to a SiN film, and may be any of those capable of ensuring a certain degree of etching selectivity with respect to the insulating film 108 formed thereon.

A silicon oxide film may further be formed under the SiN film, and between the silicide layer and the SiN film. This configuration calls for etching of the silicon oxide film, so that also the insulating film 108 again composed of a silicon oxide film may slightly be etched from the top, but only to a non-problematic degree.

The insulating film 108 may be a low-k film, rather than being limited to silicon oxide film. The low-k film may be exemplified by MSQ, SiOCH, HSQ and organic films.

According to the embodiment of the present invention, which is characterized in that the contact hole, having the Ni-containing silicide layer exposed therein, is cleaned with the reduced water, the depositional substance may thoroughly be removed, and a desirable level of contact resistance may be kept, since the surface of the silicide layer is unlikely to be oxidized.

According to the cleaning with the reduced water as described in the embodiment of the present invention, neither treatment with an oxidative gas nor treatment with an oxidative is necessary, and even rinsing with water after the treatment with the reduced water is unnecessary. The silicide layer may therefore be prevented from being oxidized on the surface thereof, and the contact resistance may consequently be kept at a desirable level.

Since there is no need of etching the surface of the Ni-containing silicide layer, for example, by hydrofluoric acid treatment, RF etching or the like, so that the contact resistance may be kept at a desirable level, and also leakage current may be suppressed, even if the silicide layer is thinned.

In addition, the cleaning with the reduced water may successfully terminate the dangling bonds on the surface of the Ni silicide with H, and this contributes to further prevent the surface from being oxidized.

The embodiment and the plurality of modifications described in the above may of course be combined, so far as no contradiction may arise thereamong. The configurations of the individual components specifically described in the embodiment and modified embodiments may be modified in various ways, so far as the object of the present invention may be satisfied.

It is apparent that the present invention is not limited to the above embodiments, that may be modified and changed without departing from the scope and spirit of the invention.

What is claimed is:

1. A method of manufacturing a semiconductor device comprising:
    removing, by dry etching, an insulating layer which is formed on a Ni-containing silicide layer to thereby at least partially expose said Ni-containing silicide layer; and
    cleaning the exposed portion of said Ni-containing silicide layer using reduced water,
    wherein said reduced water comprises an electrolytically reduced water which includes 0.01 ppm or more and 1000 ppm or less of ammonia.

2. The method of manufacturing a semiconductor device as claimed in claim 1, wherein said reduced water comprises a basic, reductive aqueous solution.

3. The method of manufacturing a semiconductor device as claimed in claim 1,
    wherein said reduced water comprises a hydrogen-enriched water.

4. The method of manufacturing a semiconductor device as claimed in claim 3, wherein said hydrogen-enriched water comprises a water obtained by dissolving hydrogen gas into an aqueous dilute ammonia solution.

5. The method of manufacturing a semiconductor device as claimed in claim 1, wherein said reduced water has a pH value larger than 7, and has a negative ORP (oxidation-reduction potential).

6. The method of manufacturing a semiconductor device as claimed in claim 5, wherein said negative ORP has a value −800 mV or larger, and −500 mV or smaller.

7. The method of manufacturing a semiconductor device as claimed in claim 1,
    wherein, after said at least partially exposing said Ni-containing silicide layer, an exposed surface of the Ni-containing silicide layer is cleaned using said reduced water, without subjecting said exposed surface to any treatment using a gas which contains an oxidative gas, and without exposing said exposed surface to any liquid of pH≦7.

8. The method of manufacturing a semiconductor device as claimed in claim 1, wherein,
    in said removing by dry etching an insulating layer, a recess is formed in said insulating layer; and
    in said cleaning, said recess is cleaned using said reduced water.

9. The method of manufacturing a semiconductor device as claimed in claim 8, wherein said insulating layer comprises at least a first insulating film, and a second insulating film formed on the top surface thereof.

10. The method of manufacturing a semiconductor device as claimed in claim 9, wherein said forming said recess further comprises:
    selectively etching said second insulating film using a resist layer as a mask;
    removing said resist layer; and
    selectively etching said first insulating film using said second insulating film as a mask.

11. The method of manufacturing a semiconductor device as claimed in claim 9, wherein said first insulating film comprises a silicon nitride film.

12. The method of manufacturing a semiconductor device as claimed in claim 10, wherein said second insulating film comprises a silicon oxide film.

13. The method of manufacturing a semiconductor device as claimed in claim 8, wherein said Ni-containing silicide layer is exposed at a bottom of said recess.

14. The method of manufacturing a semiconductor device as claimed in claim 1, further comprising:

after said cleaning using said reduced water, a process of drying a cleaned surface of the exposed portion, without exposing said cleaned surface to any liquid of pH≦7.

15. The method of manufacturing a semiconductor device as claimed in claim 14, further comprising:
after said drying said cleaned surface, a process of forming a barrier metal and a metal film in said recess.

16. The method of manufacturing a semiconductor device as claimed in claim 15, wherein, after said drying said cleaned surface, said barrier metal and said metal film are formed in said recess, without subjecting said dried surface to any treatment using a gas which contains an oxidative gas, and without exposing said dried surface to any liquid of pH≦7.

17. The method of manufacturing a semiconductor device as claimed in claim 15, wherein, after said cleaning using said reduced water, said Ni-containing silicide layer is not exposed to water, over the period from the point of time when said Ni-containing silicide layer is covered with said reduced water, and up to the point of time when said barrier metal and said metal film are formed in said recess.

18. The method of manufacturing a semiconductor device as claimed in claim 1, wherein said Ni-containing silicide layer comprises one of a NiSi layer, a NiPtSi layer, and a stack of these layers.

19. The method of manufacturing a semiconductor device as claimed in claim 1, wherein said insulating layer comprises a low-k film.

20. The method of manufacturing a semiconductor device as claimed in claim 1, wherein a pH value of said reduced water is greater than 8.

* * * * *